United States Patent [19]

Maroney et al.

[11] Patent Number: 4,720,048

[45] Date of Patent: Jan. 19, 1988

[54] CART FOR TRANSPORTING CIRCUIT COMPONENTS

[75] Inventors: Ralf P. Maroney, Orange; Gregory A. Fishkind, Milford, both of Conn.

[73] Assignee: Plug-In Storage Systems, Inc., Milford, Conn.

[21] Appl. No.: 813,576

[22] Filed: Dec. 26, 1985

[51] Int. Cl.$^4$ ............................................... B62B 3/10
[52] U.S. Cl. ........................... 280/47.34; 280/79.1 A; 361/217
[58] Field of Search ............ 280/47.34, 47.41, 79.1 R, 280/79.1 A; 312/183, 184, 250; 361/212, 214, 217; 220/334, 335, 336, 340; 144/1.12

[56] References Cited

U.S. PATENT DOCUMENTS

| | | | |
|---|---|---|---|
| 504,476 | 9/1893 | Kelley | 280/47.37 R |
| 3,405,001 | 10/1968 | Iler | 252/500 |
| 3,493,085 | 2/1970 | Libhart | 188/1.12 |
| 3,779,393 | 12/1973 | Grandell | 312/184 |
| 4,223,368 | 9/1980 | Battilo | 206/328 |
| 4,231,901 | 11/1980 | Berbeco | 206/523 |
| 4,293,070 | 10/1981 | Ohlbach | 206/328 |
| 4,373,175 | 2/1983 | Mykkanen | 361/212 |
| 4,459,633 | 7/1984 | Vandermark | 361/212 |
| 4,469,239 | 9/1984 | Gallery, IV et al. | 220/334 |
| 4,512,591 | 4/1985 | Plante | 280/79.1 A |
| 4,527,694 | 7/1985 | Bolt et al. | 312/184 |
| 4,577,526 | 3/1986 | Breidegam | 361/212 |

FOREIGN PATENT DOCUMENTS 1233244  10/1960  France .............................. 361/217

OTHER PUBLICATIONS

The Hon Company; Hon Environ 1, Feb. 1975 p. 32.
"EOS/ESD Glossary of Terms", Jul. 1984 Draft, EOS-/ESD Association, Inc., pp. 1–19.

Primary Examiner—John J. Love
Assistant Examiner—Richard M. Camby
Attorney, Agent, or Firm—Kramer, Brufsky & Cifelli

[57] ABSTRACT

A transport vehicle for enabling a user to wheel one or more sensitive electronic components such as circuit board modules from one location to another without subjecting the components to electrical field damage. The transport vehicle is in the nature of a cart formed from a conductive tubular framework supported on wheels. Slidably received between a pair of parallel frame members is a bin formed from a material which has an outer conductive layer forming a Faraday shield and an inner conductive layer or, alternatively, a static dissipative conductive layer which offers a slow, more controlled bleed of static electricity. The conductive outer layer of the bin is in contact with the conductive frame of the transport vehicle so that all ambient static electricity which may impinge upon the transport vehicle will be conducted from the frame or from the bin through the frame, which can be grounded, to safely discharge the static electricity rather than have it come in contact with an electronic component which may be housed in the bin for transport.

19 Claims, 15 Drawing Figures

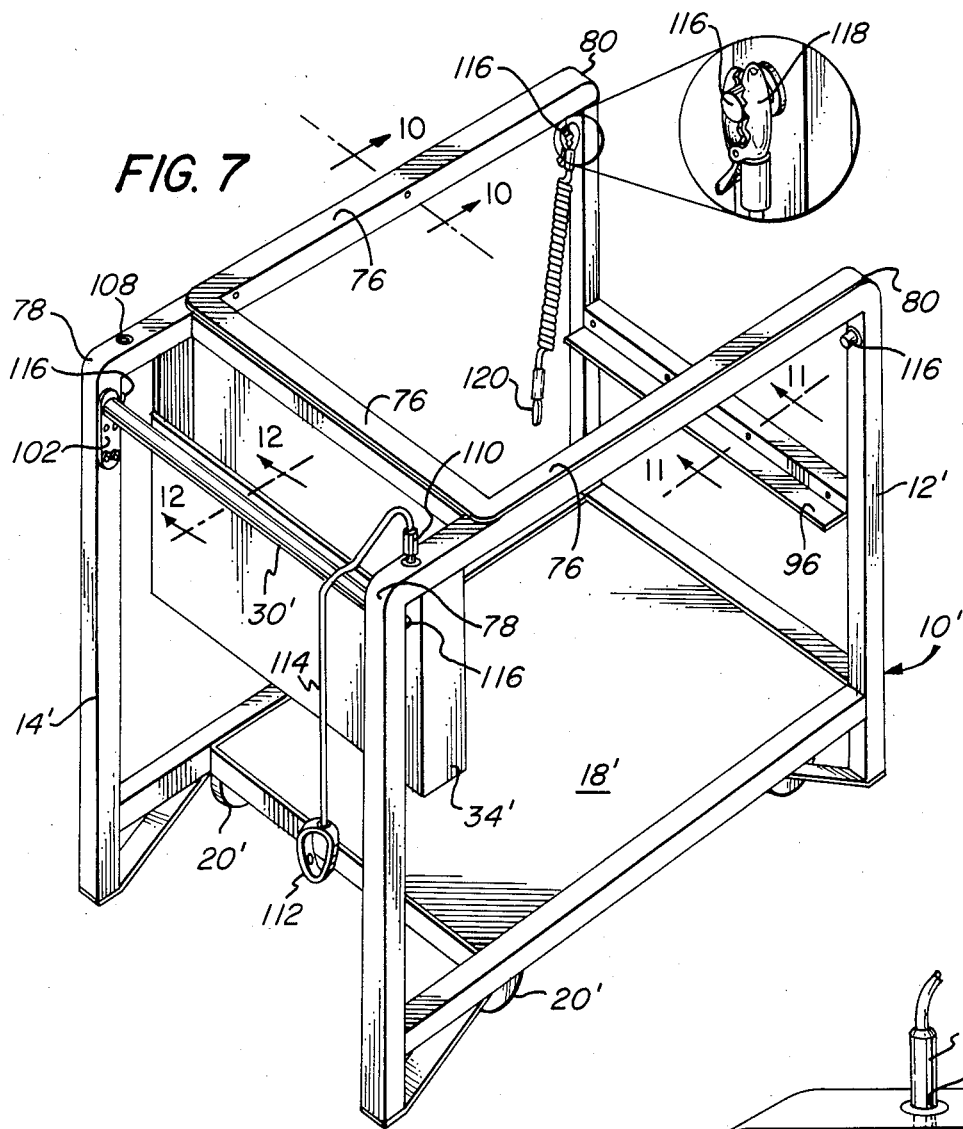
FIG. 7
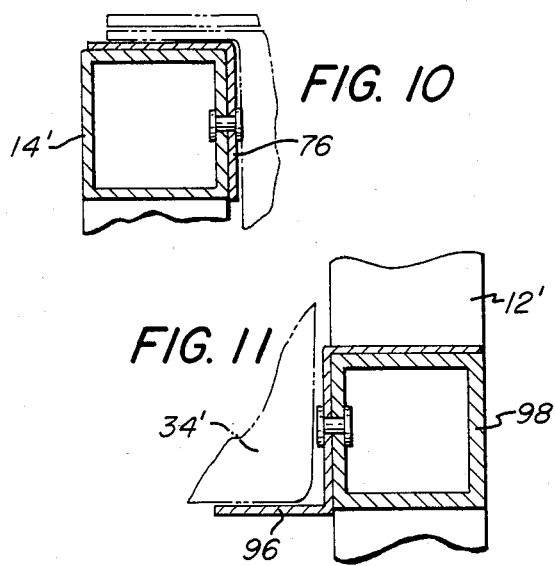
FIG. 10
FIG. 11
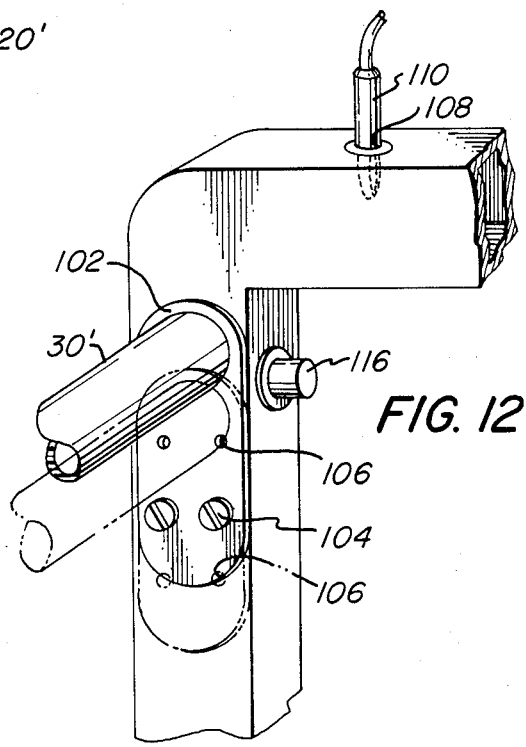
FIG. 12

CART FOR TRANSPORTING CIRCUIT COMPONENTS

BACKGROUND OF THE INVENTION

1. Field Of The Invention

The present invention relates a wheeled transport device, and more particularly, a cart for transporting sensitive electronic circuit boards, components thereof, and computer tapes or the like, subject to electrical field damage, while providing protection against such damage during transit from one location to another.

2. Description Of The Prior Art

Electronic devices and circuit boards, such as those used by the telecommunication and electronic industries, contain expensive solid-state and microelectronic components which are extremely sensitive to electrical field damage, such as, electrostatic discharges from their ambient surroundings (ESD), electromagnetic interference (EMI), radio frequency interference (RFI), and electromagnetic pulses (EMP). Often, such devices can run in the thousands or tens of thousands of dollars each, yet can be destroyed; e.g., by transient static charges such as those which sometimes jump from a person's hand to a metal handrail or the like under conditions of low humidity. Such circuit boards can also be destroyed by the uncontrolled, rapid discharge of components thereon after removal of the boards from active service in a computer, switching system, or the like. It is therefore necessary to protect such circuit boards against electrical field damage as they are being transported from a storage or use location under ambient conditions.

Prior solutions to this problem has centered around containers for housing the circuit boards, components, or tapes, such as plactic bags or cartons, which are rendered conductive with an appropriate anti-static angent. Chemical agents for providing anti-static properties are disclosed, for example, in U.S. Pat. No. 3,405,001. It also has been common to handle and store circuit board modules in plastic barrier bags or plastic blocks such as "Styrofoam" which have been treated with such an anti-static chemical agent. Examples of known anti-static containers for electronic parts are provided in U.S. Pat. Nos. 4,293,070 and 4,231,901. The '070 patent discloses a container composed entirely of paperboard coated on the inside surfaces with conductive carbon black particles to prevent an outside static electricity charge from passing through the container. In the '901 patent, a urethane foam having electrically conductive properties is used to wrap electronic components to protect them from static charge. The foam contains a binding agent and is impregnated generally uniformly therethrough with an electrically conductive amount of an electrically conductive particulate material, e.g., carbon black, silver, aluminum or a metal salt. U.S. Pat. No. 4,223,368 discloses an electrostatic discharge protection device adapted to be clipped onto edge connectors of a circuit board assembly. The device includes a shunt for electrically short-circuiting the edge connectors of the board.

When removing circuit boards from electronic mainframes, it is inconvenient to repackage the boards in individual storage containers such as cartons or bags described above in order to transport them from one location to another. However, it is imperative, because of the expense of duplicating such a board that such boards be protected against electrical field damage as they are being transported from one location to another.

The present invention relates to a cart with a Faraday shielded container, i.e., one where electrical field charges will circulate about the container to ground, which can be used as a transport vehicle for such sensitive electronic boards so they will not be subject to electrical field damage from the ambient surroundings or from rapid electrostatic discharges from the board itself during transport.

SUMMARY OF THE INVENTION

In accordance with the invention a transport vehicle is provided for enabling a user to wheel one or more electronic devices such as circuit board modules from one location to another. The transport vehicle is in the nature of a cart formed from a conductive tubular framework supported on wheels. Slidably received between a pair of parallel frame members is a bin formed from a material which has an outer conductive layer to provide a Faraday shielded container and an inner conductive layer or, alternatively, a static dissipative layer which is conductive of a controlled rate to offer a slow, more controlled bleed of static electricity. The conductive outer layer of the bin is in contact with the conductive frame of the transport vehicle so that all ambient static electricity, or electromagnetic interference, radio frequency interference or electromagnetic pulses, which may impinge upon the transport vehicle, will be conducted from the frame or from the bin through the frame, which can be grounded to safely discharge the electrical field rather than have it come in contact with an electronic circuit board module which may be housed in the bin for transport. The conductive inner layer or static dissipative inner layer of the bin will have a surface positioned adjacent the board or component so that any static charge, for example, on the board itself will be conducted and, if desired, slowly bled to the conductive outer layer through the conductive frame and thence, to ground, protecting the board from potential damage.

The bin is provided with parallel tracks which are J-shaped in cross-section with the longer legs thereof being furthest removed from each other. The tracks receive a folder bent back upon itself which forms a carrier for one electronic module being transported by the transport vehicle or cart. The ends of the folder have downwardly extending projections which are received in spaced relation within the J-shaped tracks on each side of the bin so that they can be supported in the bin and, in turn, receive one of the electronic printed circuit boards or modules between the folded halves. The folders can be formed from conductive material, whose conductive rate can be controlled from relatively fast (conductive) to a slow bleed, (or static dissipative) even to an imperceptible rate, (or anti-static). If conductive, it will conduct any static electricity charge away from the electronic circuit board through the conductive or static dissipative layer of the interior of the bin, the conductive frame, and then to ground. If static dissipative, this will aid in preventing any static charge from accumulating in proximity to the board and will also serve as a slow-bleed conductor through the bin and cart frame to ground of any static discharge from the board itself. If anti-static, this will prevent any static charge from being generated by friction of the components against the folders while the components are in transit.

The support of the folder within the tracks of the bin enables the folders to be slid relative to the tracks and in the tracks, to make room and accommodate additional folders and electronic board modules or components.

A cover provided with an upper conductive layer can be seated on the top of the bin and can also be used to conduct electrostatic charges through the frame to ground. The cover can be provided with an interior layer of either conductive or static dissipative material so as to provide safe surface adjacent each of the modules. In the event of a static discharge from the component itself, the cover will conduct the charge away from the module through the conductive layer, and the conductive frame to ground.

The cover can be provided with a living hinge so that it can be folded in half over itself whereupon one of the modules can be removed and safely placed on the now exterior conductive or static dissipative surface formed by the interior surface folded back upon itself, so that repairs or other modifications of the electronic circuit board can be made prior to its being used at a new location. Tabs extend outwardly from opposed edges of the cover to enable the cover to be readily grasped and folded.

BRIEF DESCRIPTION OF THE DRAWINGS

Further objects and advantages of the invention will become apparent from the following description and claims, and from the accompanying drawings wherein:

FIG. 7 is a perspective view of an alternative form of the transport vehicle of the present invention with its carrying bin removed and including an upper portion of the vehicle enlarged in a circle to illustrate the details thereof;

FIG. 10 is a cross-sectional view taken substantially along the plane indicated by line 10—10 of FIG. 7;

FIG. 11 is a cross-sectional view taken substantially along the plane indicated by line 11—11 of FIG. 7;

FIG. 12 is a cross-sectional view taken substantially along the plane indicated by line 12—12 of FIG. 7;

DETAILED DESCRIPTION OF THE PREFERRED EMBODIMENT

Figure 1:
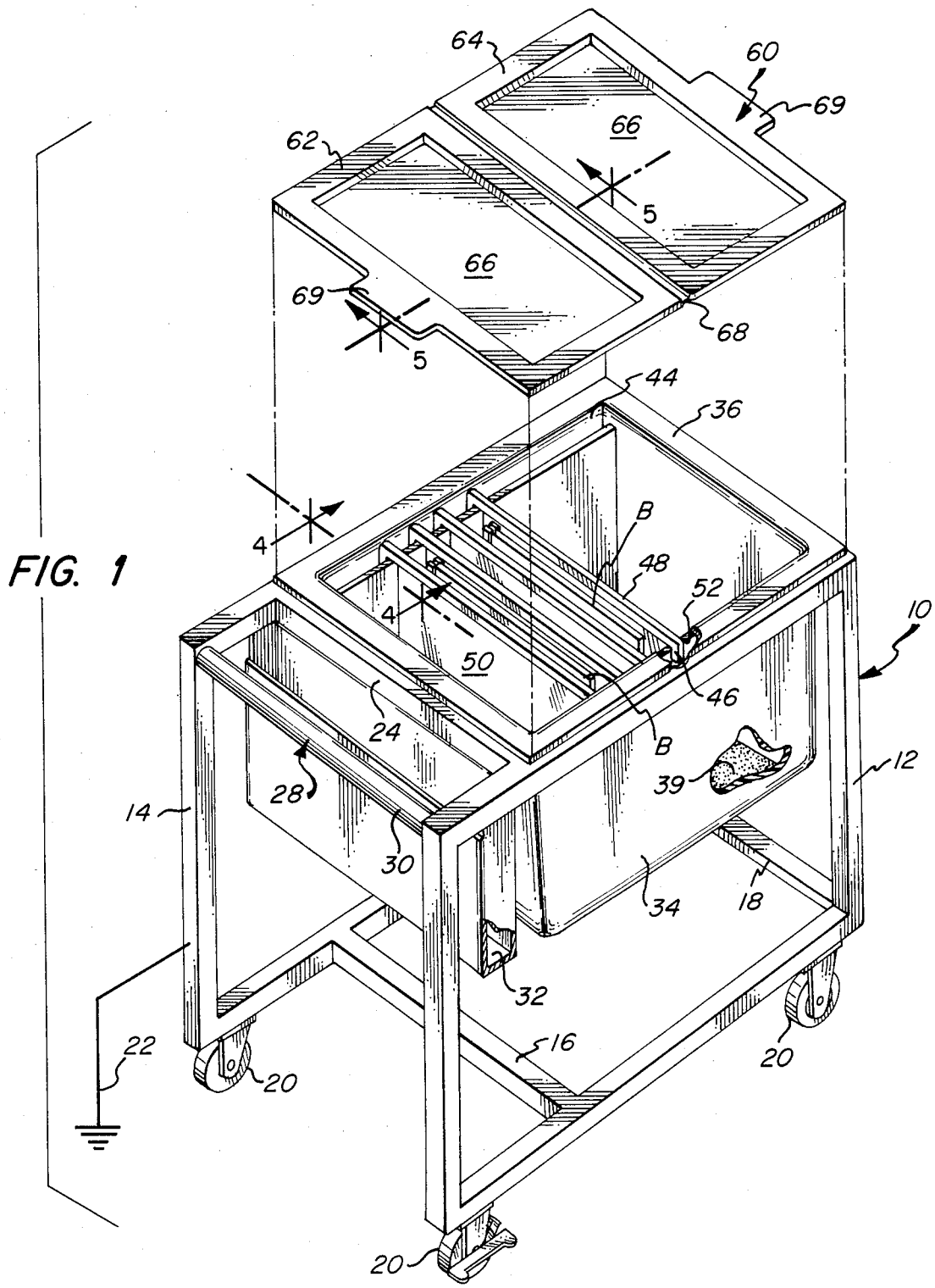
FIG. 1 is an exploded perspective view of the transport vehicle of the present invention.
Figure 2:
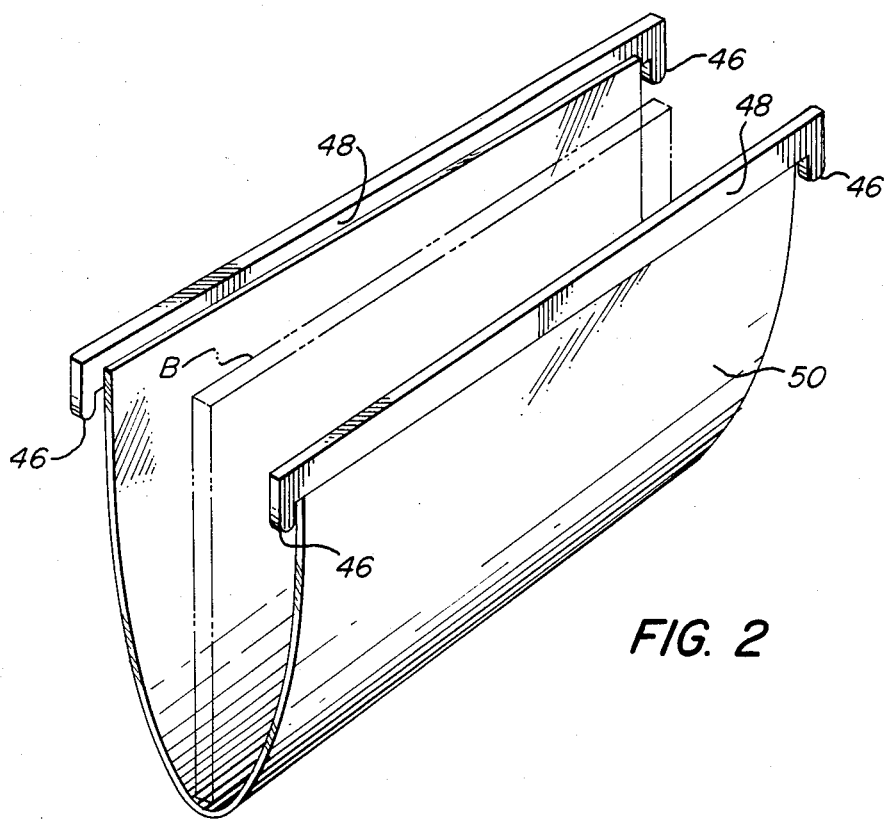
FIG. 2 is a perspective view of a folder containing an electronic circuit board component illustrated in phantom lines which is used in conjunction with the transport vehicle of FIG. 1 to transport a circuit component from one location to another.

Referring now to the drawings in detail, wherein like numerals indicate like elements throughout the several views, the transport vehicle or cart 10 of the present invention illustrated in FIG. 1 includes a pair of parallel, substantially rectangular frame members 12, 14 made from hollow, rectangular or circular in cross-section, tubular material which is conductive, e.g., stainless steel, aluminum, or a conductive plastic. Horizontal tie members 16, 18 maintain the bottom of frames 12, 14 in spaced relation, and wheels or casters 20 are provided on the bottom of the frame members 12, 14 so that the transport vehicle or cart 10 can be rolled from one location to another, and the wheels can also serve as a path to ground when in use on a conductive floor. The top of each of the frame members 12, 14 are also connected by horizontal tie members 24, 26 and a horizontal handle 28 which may be provided with an outer layer of anti-static, static dissipative, or conductive material 30 as will be described more fully hereinafter. An electrical wire such as 22 can be connected to any one of the frame members 12, 14 so the frame can be grounded through an electrical plug to an electrical outlet grounded at the site.

A rectangular parallelopiped container 32 formed from any type of material, may be secured between the rectangular frame members 12, 14 in any suitable known manner, for example, by adhesive or fasteners. The container 32 may be used to house papers, charts, or the like relating to the electronic modules and their location which can be transported by the cart 10.

A bin 34 which is substantially rectangular in cross section is supported on the upper horizontal members of each of the frames 12, 14 and on each of the horizontal tie members 24, 26. Bin 34 includes a horizontal flange 36 which sits on the frame and tie members so that the bin is supported on the cart 10, but yet, can be lifted upwardly and removed therefrom, so that the bin can be shipped with modules from one location to another. The side walls of the bin 34 are slightly tapered to facilitate their removal from the interior of the frame, as illustrated more clearly in FIG. 6.

Bin 34 is formed at least having an outer layer or ply 38 of conductive material to form a Faraday shield so that any static charge impinging thereon, for example, will be conducted from the outside of the bin through frame portions 12, 14 to ground through wire 22, or when using conductive wheels to a conductive surface floor material that is itself grounded. This will keep the static charges from impinging upon any electrical components which are transported in bin 34. In addition, it has been found desirable to not only make the entire bin from conductive material but alternatively, to provide it with anti-static or static dissipative properties at least on its interior surface which would be adjacent to the electronic modules so to prevent static charges from building on the surfaces adjacent to the electronic components being transported in bin 34 or to render these surfaces static dissipative so as to slowly bleed an electrical discharge from any of the components on the electronic circuit board to the outer conductive layer of the bin, and then to ground. Accordingly, in a preferred embodiment the bin is formed from an outer layer or ply of conductive material 38, which can be plastic, and an inner layer or ply of static dissipative material 40, if desired.

Two electrical characteristics are of concern in choosing a suitable conductive plastic for use to form the inner layer or ply 40 of bin 34. The first is the ability of the material to safely dissipate the charge on a printed circuit board. If the bin material is too conductive, electrostatic discharge can occur due to the rapid discharge of the printed circuit board through the bin side wall. It has been found that an ohmic material with a sheet resistance or surface resistivity of approximately $10^6$ to $10 S^{13}$ ohms (per square) is sufficient to safely discharge charged devices. The second electrical factor of importance in such a material is the ability to dissipate charges that may be generated due to triboelectric factors. For instance, when dragging the material across a bench top or across a floor, the rubbing of the material against the dissimilar material of the bench top or floor can create static charge. The ability of the material to dissipate this charge is measured by its decay rate. A suitable material should have a mean decay rate of about 0.5-2 seconds or less when charged to 3,000 to 5,000 volts.

A suitable plastic for forming the bin 34 which has an outer conductive layer 38 and an inner static dissipative layer 40 with the above-mentioned characteristics is manufactured by NOW Plastics Corporation of Staatsburg, N.Y., under the trademark "UNIFUSE". This material has an outer ply or conductive layer 38 provided with a surface resistivity or sheet resistance of $10^3$-$10^5$ohms (per square). The interior layer 40 is provided with a surface resistivity or sheet resistance of $10^9$-$10^{12}$ ohms (per square) and a mean decay rate of 0.6 seconds when charged to 5,000 volts.

Thus, any electrostatic discharge from the ambient surroundings of bin 34 will impinge on the outer layer 38 and can be conducted to ground through the frame portions 12, 14 and wire 22, or via conductive wheels 20 to a conductive, grounded surface. The interior layer 40, which will be adjacent any electronic module or printed circuit board transported within the cart or transport vehicle 10 will be static dissipative if an electrostatic discharge occurs from the board as the charge will travel and be slowly dissipated through the layer 40 and then through the conductive layer 34 and frame 12, 14 to ground through wire 22, or via the conductive wheels through a conductive floor surface which is suitably grounded. In addition, because of the anti-static properties, that is, the high sheet resistance in the $10^9$-$10^{12}$ ohms (per square) range, the chance of static discharge between the board and the interior of the bin enclosure is greatly reduced.

Figure 3:
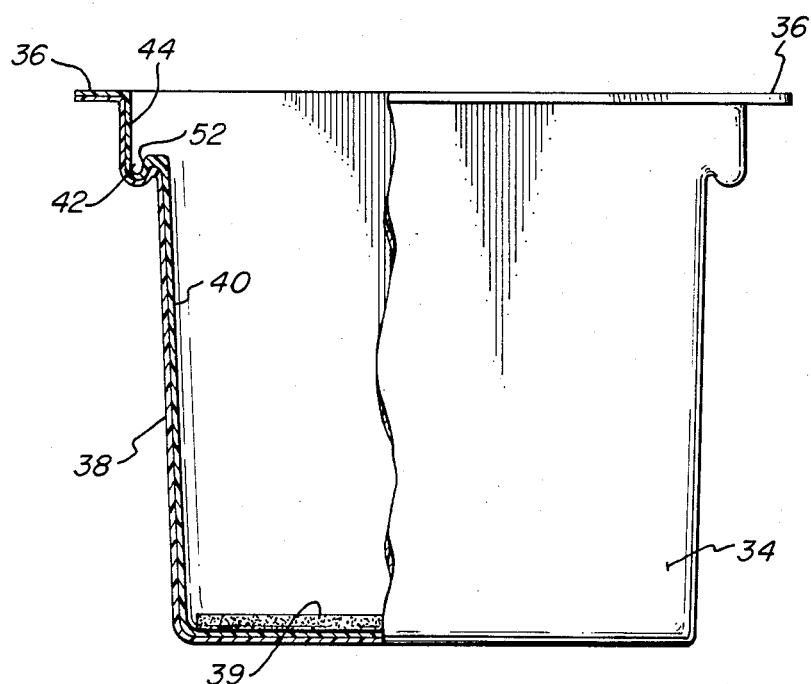
FIG. 3 is a side view in elevation, partially in section of the bin portion of the transport vehicle of FIG. 1 which receives one or more of the folders of FIG. 2.
Figure 4:
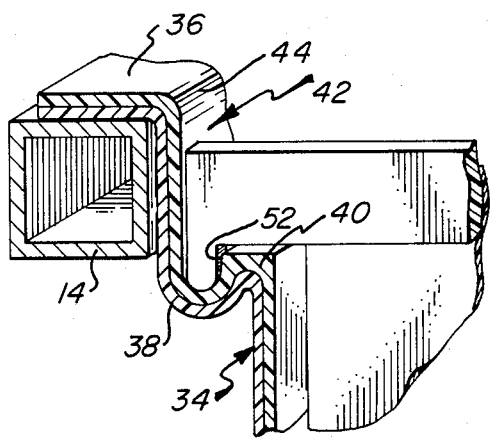
FIG. 4 is an enlarged cross-sectional view taken substantially along the plane indicated by line 4—4 of FIG. 1.

Each of the sides of bin 34 adjacent the opposed frame members 12, 14 is J-shaped in cross-section as shown more clearly in FIGS. 3 and 4. The J-shaped cross-section forms a channel or track 42. The J-shaped tracks 42 have their longer legs 44 furthest removed from each other so that a downwardly extending appendage 46 at the opposite ends of a bar 48 connected to each end of a flexible folder 50 can be received in sliding engagement between the longer leg 44 and shorter leg 52 of each J-shaped channel. Disposed between the folded over portions of folder 50 is one of the electronic printed circuit boards B. The folders 50, which are folded back upon themselves and supported within opposed J-shaped tracks 42 can be slid relative to each other along the length of the bin 34 to make room for one or more of the folders and additional electronic circuit boards. Each of the folders 50 can be simply removed from the interior of bin 34 by raising it relative to and out of the tracks 42. Folders 50 are formed preferably from anti-static or static dissipative conductive plastic.

The bottom of bin 34 can be provided with a layer of static dissipative or anti-static conductive foam 39 to cushion the fall of a module on board B inadvertently placed between, rather than into one of the folders 50. Because of the antistatic properties of the foam, the board B would be protected against static discharge between the module and the interior bottom of bin 34.

Figure 5:
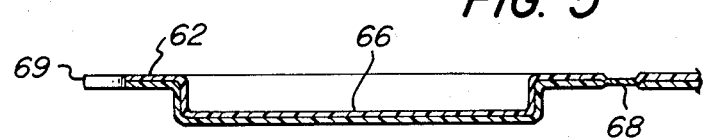
FIG. 5 is a cross-sectional view taken substantially along the plane indicated by line 5—5 of FIG. 1.
Figure 6:
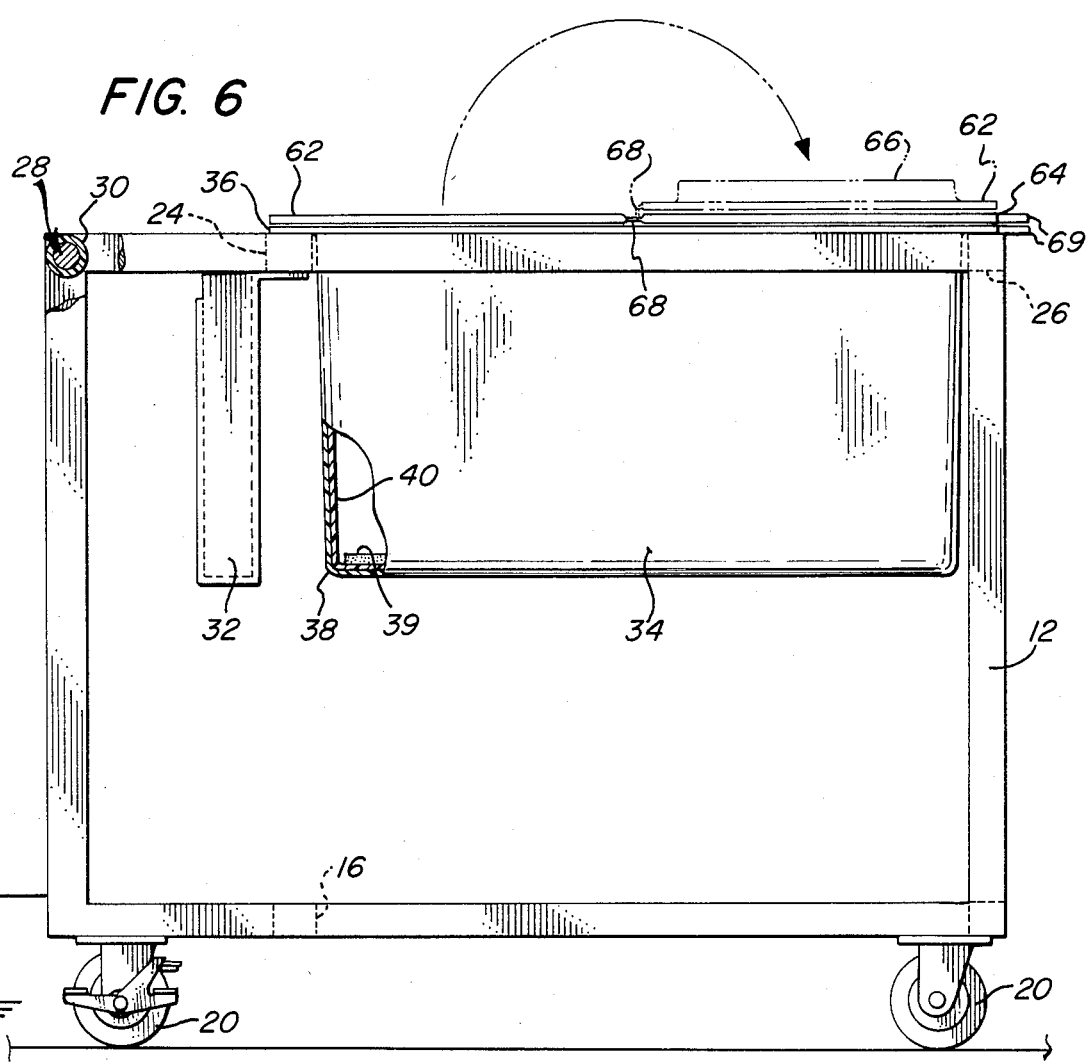
FIG. 6 is a side view and elevation, partly in section of the transport vehicle of FIG. 1 with the cover for the vehicle folded back upon itself, in phantom lines, to be used as a worktable.

As shown in FIGS. 1, 5 and 6, a cover 60 can be provided for seatng on the flange 36 of bin 34 to protect the contents of the bin and provide a Faraday shield around the top sidewalls and bottom of the bin to protect the contents from electrostatic charges as the electronic printed circut boards B are transported from one location to another. Cover 60 includes a pair of rectangular frames 62, 64 having a depressed central portion 66. Each of the frames 62, 64 can be joined by a living hinge 68 therebetween joining adjacent portions of each of the frames 62, 64 so that as indicated in phantom lines of FIG. 6, the cover may be folded 180 back upon itself so that one of the depressed portions 66 will be raised. By providing the hinge 68 the cover can be folded back upon itself so that the portion 66 which is raised can be used as a work surface or a temporary support for one of the boards B when it is removed from an installation. Alternatively, the cover can completely enclose the boards within bin 34 as they are transported. The cover can be secrued in a closed position by means of clips or fasteners. Each opposed outer edge of cover 60 is provided with a tab 69 facilitating grasping of cover 60 for folding about hinge 68.

As illustrated in FIG. 5, the cover 60 can also be formed from an inner and outer ply or layer of material identical to that formed in the bin 34 so that when the cover is closed, the static dissipative conductive layer will be adjacent to boards B within the bin 34 and the conductive layer will be in contact with the conductive flange 36 of the bin 34 to conduct ambient elecrostatic charges to ground through the conductive frames 12, 14. The interior surface of the cover 66 will discourage electrostatic discharge from the electronic component boards; but, if a static charge is received, it will slowly dissipate it to ground. Further, since the interior surface of cover 60 will be static dissipative, it can be readily used to support one of the electronic boards with reduced chance of electrostatic discharge from the board while it is being worked on in the position shown in FIG. 6.

Figure 14:
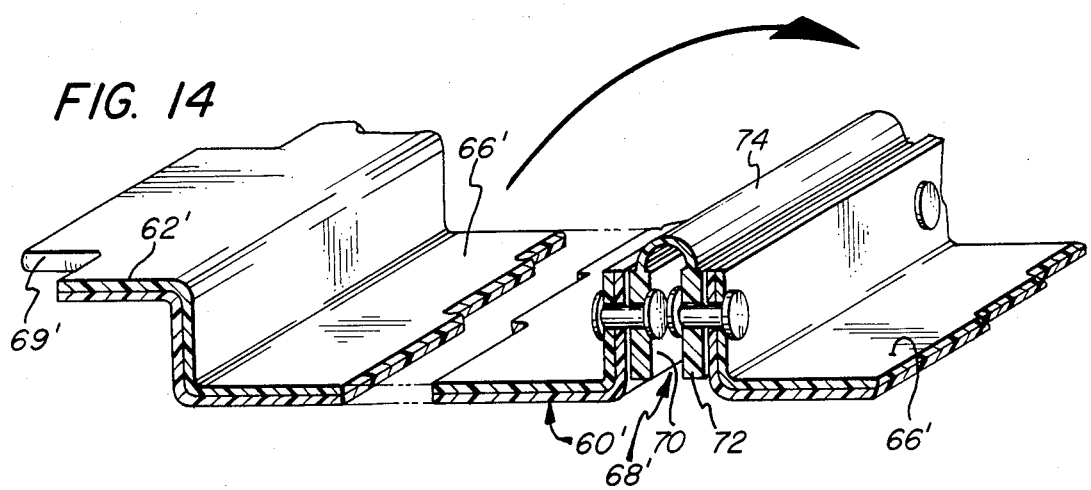
FIG. 14 is a partial, enlarged cross-sectional view of an alternative form of cover for the bin of the transport vehicle.

An alternative form of cover 60' which can be used with the bin of the present invention is illustrated in FIG. 14. Primed numerals correspond to the identical elements associated with cover 60 and need no further explanation of their intended function. The difference between covers 60 and 60' is in the living hinge construction. Rather than a flexible reduced thickness web 68, the hinge 68' consists of a pair of parallel blocks 70,72 of conductive or static dissipative material joined by rivets or the like to the upright adjacent sidewalls surrounding depressed portion 66'. An inverted U-shaped flexible web 74 connects the blocks 70,72 and can be bent or pivoted about its longitudinal axis to fold one-half of the cover relative to the other.

FIG. 7 illustrates a modified form of a transport vehicle 10' which can also be formed in accordance with the principles of the invention. Primed numerals indicate elements corresponding in function and operation to those of transport vehicle 10 of FIG. 1.

The transport vehicle or cart 10' also includes a pair of parallel, substantially rectangular frame members 12', 14' made from hollow, rectangular or circular in cross-section, tubular material such as stainless steel. As shown more clearly in FIG. 10, the top and interior side surfaces of each frame members 12', 14' can be provided with an angle-iron 76 of aluminum riveted thereto to increase the conductivity of these surfaces without sacrificing structural rigidity. Further, the top corners 78,80 of the frame members are rounded (80 greater than 78) to reduce the number of sharp edges on the vehicle frame which may strike an adjacent surface during movement of the vehicle to jostle the boards B or make contact with the equipment the boards are inserted into or removed from.

Figure 9:
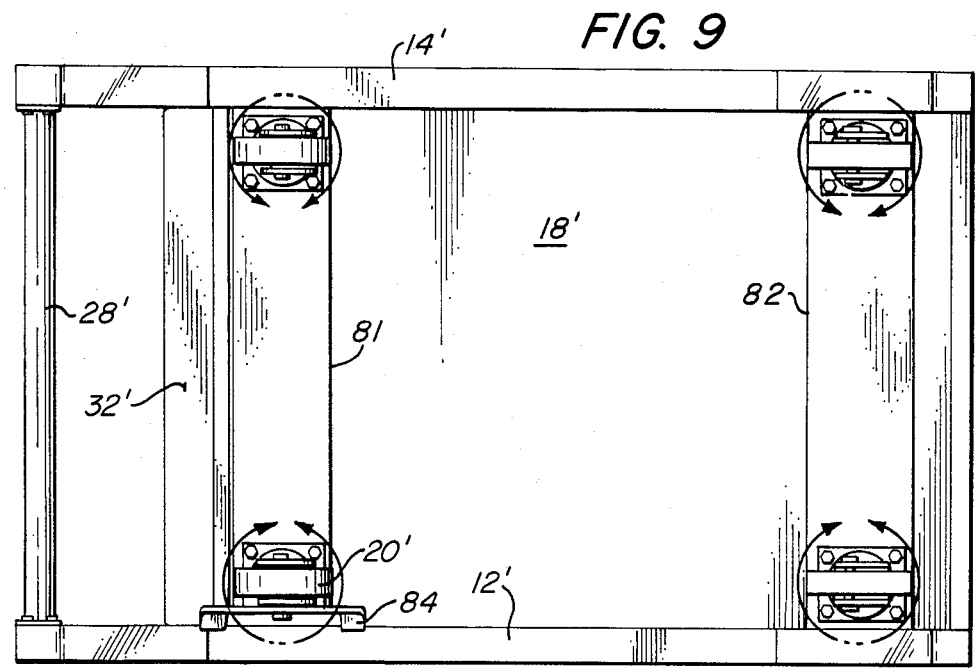
FIG. 9 is a bottom plan view of the transport vehicle of FIG. 8.

A horizontal platform 18' maintains the bottom of frames 12',14' in spaced relation, and wheels or casters 20' are provided on the bottom of the frame members 12',14' so that the transport vehicle or cart 10' can be rolled from one location to another. The casters 20' are mounted for swiveling about a vertical axis on bar supports 81, 82 beneath platform 18' which extend between frames 12',14'. As indicated in FIG. 9, all of the casters lie within the rectangular bottom plan of the transport vehicle 10' to preclude contact with external projection, e.g. fuses, plugs, jacks, pins and the like protruding from equipment adjacent the vehicle 10'.

Figure 15:
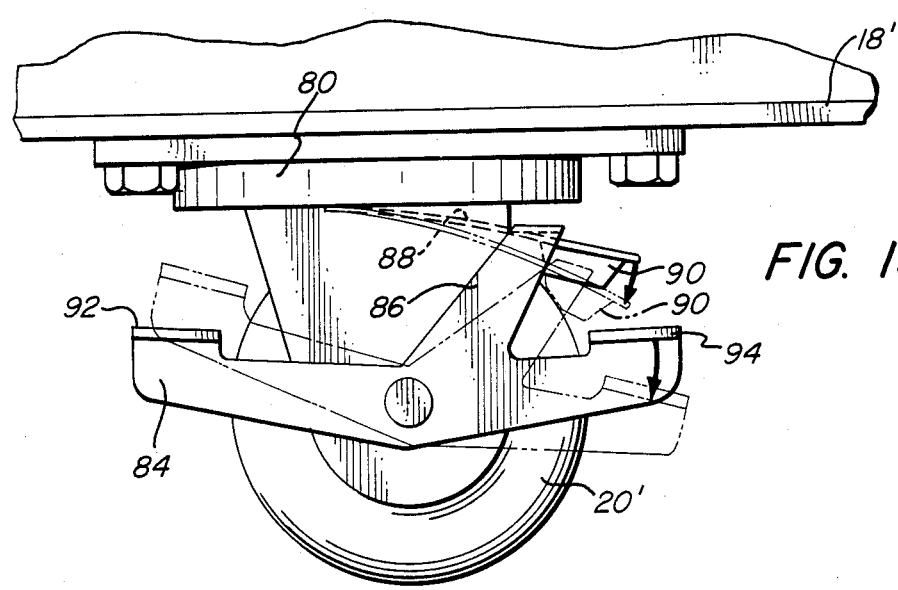
FIG. 15 is a side view in elevation of a caster and brake which can be attached to the frame of the transport vehicle of either FIG. 1 or FIG. 7.

One of the casters 20' as shown in FIG. 15, includes a pivotable lever 84 having an arm 86 in contact with a leaf spring 88 having one end mounted on bar 81 and a block of friction material 90 on its other end. Lever 84 has foot pedals 92,94 on opposite ends. Contact with foot pedal 94 will cause lever 84 and arm 86 to pivot in a clockwise direction as seen in FIG. 15, to engage block 90 with caster wheel 20 and brake rotation thereof and thus retain the vehicle 10 in place. Contact with foot pedal 92 rotates lever 84 and arm 86 in a counterclockwise direction enabling spring 88 to rise and remove block 90 from contact with caster 20'. The casters 20, can be of a conductive material to ground the cart to a conductive floor surface. The casters 20 can alternatively be of an insulative material to protect against the introduction of a static charge from a carpeted floor surface.

The top of each of the frame members 12',14' are also connected by a horizontal tie member 24' and a horizontal handle 28' which may be provided with an outer layer of anti-static or static dissipative material or may even be formed of insulative or non-static generating material. Tie member 24' also includes an aluminum angle iron 76 covering the top and interior side surface thereof.

Figure 8:
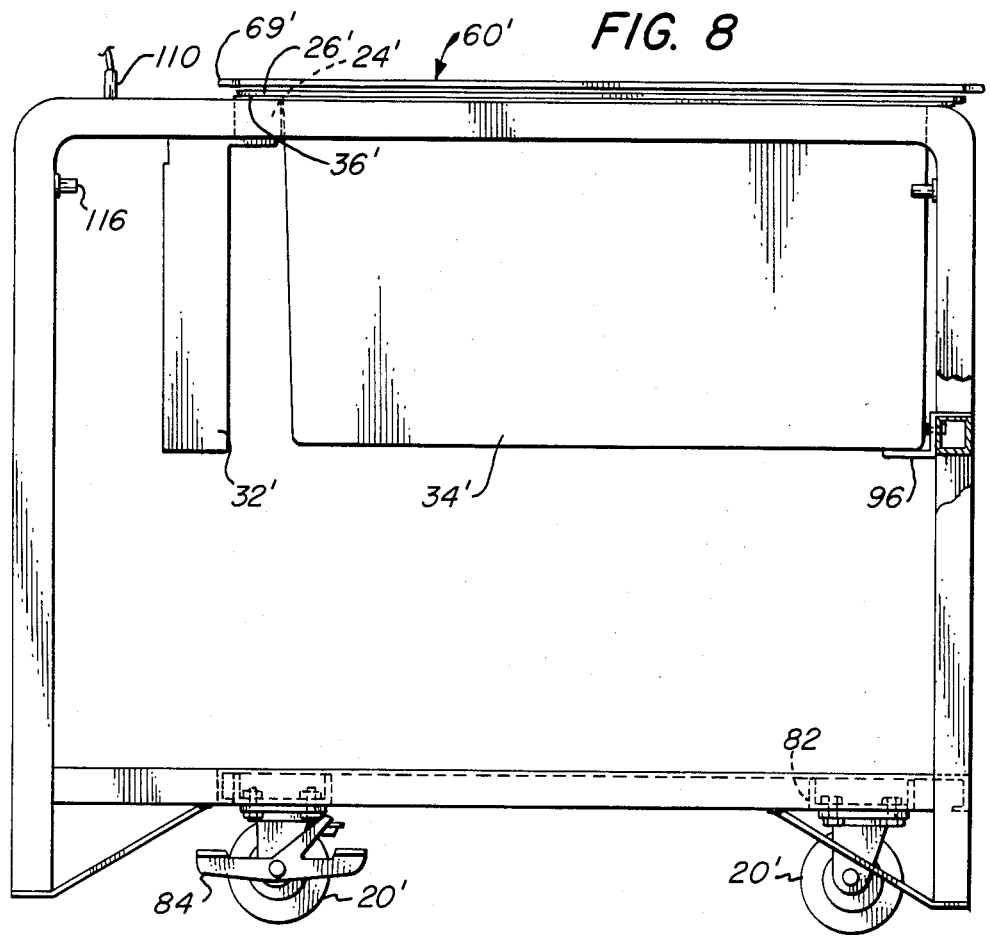
FIG. 8 is a side view in elevation of the transport vehicle of FIG. 7 with a carrying bin in place on the vehicle.

A bin 34' which is substantially rectangular in cross section is suproted on the upper horizontal members of each of the angle irons 76 on frames 12',14' and horizontal tie member 24. A Z-shaped in cross-section, aluminum bracket 96 is attached to a tie member 98 mid way between the top and bottom of frames 12' and 14' to form a support for the bottom of bin 24' (see FIGS. 8 and 11). This enables the bin 34' to be removed readily from the side of the vehicle 10' rather than having to lift the same upward, which is inconvenient when the bin 34' is full and heavy or in a confined overhead area.

Bin 34' is formed as bin 34 having an outer layer or ply of conductive material so that any static charge impinging thereon will be conducted from the outside of the bin through angle irons 76 or bracket 96 and frame portions 12',14' to ground. This will keep the static charges from impinging upon any electrical components which are transported in bin 34'. The interior surface of bin 34' can be conductive or static dissipative, as desired.

Figure 13:
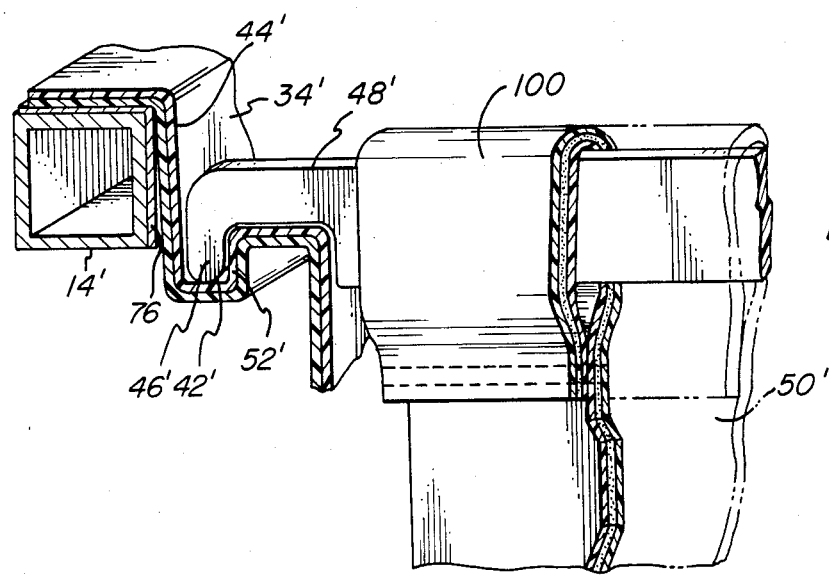
FIG. 13 is a partial, enlarged cross-sectional view similar to FIG. 4, but illustrating an alternative form of track on the bin portion of the transport vehicle for receiving another type of folder than that illustrated in FIG. 2.

Each of the sides of bin 34' adjacent the opposed frame members 12',14' is also J-shaped in cross-section as shown more clearly in FIG. 13. The J-shaped cross-section forms a channel or track 42'. The J-shaped tracks 42' have their longer legs furthest removed from each other so that a downwardly extending appendage 46' at the opposite ends of a solid plastic bar 48' connected to each end of a flexible folder 50' can be received in sliding engagement between the longer leg 44' and shorter leg 52' of each J-shaped channel.

The appendage 46' on bar 48' of each folder 50' is provided with rounded edges in contact with the track 46' which also has rounded corners. Since no flat surface readily impinges on a flat surface of the track 46', pieces of the appendages cannot flake off and fall into the interior of folder 50' where they may short one of the boards B, when the appendages are slid in each track.

The folders 50' can be formed from static dissipative or anti-static material having a foam interior sandwiched between an inner and outer layer of the material as illustrated in FIG. 13. The foam cushions contact of folder 50' with the sensitive board B. As illustrated, each end 100 of the folder is folded over bar 48' and tacked by heat to itself to hold the bar.

For convenience, the height of handle 30' may be adjusted vertically, as shown in FIG. 12. The ends of handle 30 are mounted by a bracket 102 on the interior surfaces of frames 12' and 14' by screw fasteners 104. Fasteners 104 may be relocated in preformed threaded holes 106 above and below their initial mounting for relocating handle 30' accordingly.

The handle can be made of antistatic, static dissipative, or highly conductive material, depending upon the desired effect of the electrical flow from static generated by the person pushing the cart while in use and the external floor conditions. E.g., if the cart is used on a conductive floor surface, it would be provided with a highly conductive handle material and conductive wheels or a grounding strap from the bottom of cart scraping along the floor.

Each frame member 12',14' includes a bore 108 for receipt of a banana plug 110 connected to a wrist strap 112 by a conductive wire 114. The cart pusher can thus ground himself to conduct charges in the ambient surrounding environment away from the boards B in vehicle or cart 10'. Similarly, four pintles 116 can be located adjacent the four top corners of frame 12', 14' for receipt of an alligator clip 118 electrically connected to a banana plug 120. The plug 120 can be inserted in a ground connection in a chassis where the boards are loaded or stored to ground the vehicle or cart 10' through the chassis, as an extra measure of protection.

What is claimed is:

1. A cart for transporting electronic circuit components from one location to another comprising:
   a frame formed from a first electrically conductive material including
   spaced portions providing a substantially horizontal support,
   a bin having an outer and inner surface adapted to house said electronic circuit components,
   said bin including
   a flange adapted to be seated on said horizontal support of said frame,
   at least the outer surface of said bin and flange being formed from a second electrically conductive material,
   said flange being in contact with said frame for conducting electric charge from said bin into said frame,
   wheel means on said frame for facilitating movement of said frame from one location to another, and
   means connected to said frame for electrically grounding the same.

2. The cart of claim 1 wherein the second electrically conductive material of said bin and flange is formed from material having a sheet resistance of $10^3$–$10^5$ ohms.

3. The cart of claim 2 wherein the inner surface of said bin is formed from static-dissipative material having a sheet resistance of $10^6$–$10^{12}$ ohms and a mean decay rate capable of dissipating 3,000 to 5,000 volts of electricity in 0.5–2.0 seconds.

4. The cart of claim 1 wherein said bin includes a track which is substantially J-shaped in cross-section along the opposite sides thereof terminating in said flange supported in said frame, and
   electronic component support means having downwardly extending appendages along the opposite side thereof adapted to be received in sliding engagement within each of said tracks.

5. The cart of claim 4 wherein the longer leg of each of said J-shaped tracks in said bin are further removed from each other.

6. The cart of claim 1 including
   cover means adapted to be received on the flange of said bin, said cover means including
   a pair of substantially rectangular frame portions hinged together for movement from a position forming an angle of 180° relative to each other to a position wherein one frame portion of said cover overlies the other frame portion.

7. The cart of claim 6 wherein said cover element has a pair of depressed central portions between each of said frame portions.

8. The cart of claim 7 wherein said cover element has an outer conductive layer and an inner layer of static dissipative material.

9. The cart of claim 1 including a handle extending between said frame portions enabling the user to push said cart along a support surface.

10. The cart of claim 1 wherein said wheel means are located wholly within the bottom plan projection of said frame.

11. The cart of claim 10 including brake means associated with said wheel means for precluding rotation of said wheel means.

12. The cart of claim 1 wherein the bottom of said bin includes a layer of foam material.

13. The cart of claim 1 wherein said frame is open at one end to facilitate removal of said bin.

14. The cart of claim 1 including the means on said frame for supporting the bottom of said bin.

15. The cart of claim 9 wherein said handle is adjustable in height relative to said frame.

16. The cart of claim 9 wherein said handle is formed from anti-static conductive material.

17. The cart of claim 4 wherein said circuit component support means further includes
   at least two bars each having one of said downwardly extending appendages affixed at opposite ends thereof,
   a flexible folder, said folder being affixed at opposite ends thereof to one of said bars, and
   said bars and said flexible folder being constructed of a static dissipative plastic whereby electric charge within said folder is conducted through said bars, into said track of the bin and finally away from the cart to ground.

18. The cart of claim 17 wherein said second electrically conductive material is a plastic having a sheet resistance of $10^3$–$10^5$ ohms.

19. The cart of claim 2 wherein said electrically conductive material is plastic.

* * * * *